US008080826B1

(12) United States Patent
Johnson et al.

(10) Patent No.: US 8,080,826 B1
(45) Date of Patent: *Dec. 20, 2011

(54) HIGH PERFORMANCE ACTIVE AND PASSIVE STRUCTURES BASED ON SILICON MATERIAL BONDED TO SILICON CARBIDE

(75) Inventors: Joseph H. Johnson, Phoenix, AZ (US); Pablo D'Anna, Redding, CA (US)

(73) Assignee: RF Micro Devices, Inc., Greensboro, NC (US)

( * ) Notice: Subject to any disclaimer, the term of this patent is extended or adjusted under 35 U.S.C. 154(b) by 2147 days.

This patent is subject to a terminal disclaimer.

(21) Appl. No.: 10/656,613

(22) Filed: Sep. 4, 2003

Related U.S. Application Data (63) Continuation-in-part of application No. 10/078,588, filed on Feb. 14, 2002, now abandoned.

(51) Int. Cl.
*H01L 31/0256* (2006.01)
(52) U.S. Cl. .................................. 257/77; 257/E29.104
(58) Field of Classification Search ............... 257/76, 257/77, 347, E29.001, E29.002, E29.068, 257/E29.1, E29.104; 438/455–459, 931
See application file for complete search history.

(56) References Cited

U.S. PATENT DOCUMENTS

| | | | |
|---|---|---|---|
| 5,296,047 A * | 3/1994 | Fellner | 148/33 |
| 5,349,207 A * | 9/1994 | Malhi | |
| 5,488,232 A | 1/1996 | Glass et al. | |
| 6,117,751 A | 9/2000 | Schoerner et al. | |
| 6,211,041 B1 * | 4/2001 | Ogura | |
| 6,426,968 B1 | 7/2002 | Strife et al. | |
| 6,521,923 B1 * | 2/2003 | D'Anna et al. | |
| 2003/0094672 A1 * | 5/2003 | Torvik et al. | 257/565 |

FOREIGN PATENT DOCUMENTS

JP 2001-36069 A * 2/2001

OTHER PUBLICATIONS

Wolf, Silicon Processing for the VLSI Era: vol. 1—Process Technology, Lattice Press, 2000, $2^{nd}$ edition, p. 226.*
Hiroyuki Nagasawa, Kuniaki Yogi, Takamitsu Kawahara and Naki Hatta; "3C-SiC Monocrystals Grown on Undulant Si(001) Substrates" pp. 47 & 50; Material Research Society vol. 742 ® 2003.
Zhiyun Cheng et al.; Relaxed Silicon—Germanium On Insulator (SG01); Material Research Society Symp. Proc. vol. 686; 2002 p. 21-26.

* cited by examiner

*Primary Examiner* — Ha Tran Nguyen
*Assistant Examiner* — Kevin Quinto
(74) *Attorney, Agent, or Firm* — Withrow & Terranova, P.L.L.C.

(57) ABSTRACT

The present invention discloses and claims the Silicon Carbide based Silicon structure comprising: (1) a Silicon Carbide substrate, (2) a Silicon semiconductor material having a top surface, and either bonded to the Silicon Carbide substrate via the bonding layer, or epitaxially grown on the Silicon Carbide substrate; and (3) at least one separation plug formed in the Silicon semiconductor material. The single bonding layer, or either layer of the double bonding layer, is selected from the group consisting of: {a Silicon dioxide layer; a Silicon layer; a carbon layer; a Silicon germanium (SiGe) layer; a tungsten silicide layer; a titanium suicide layer; and a cobalt silicide layer}. The separation plug extends from the top surface of the Silicon semiconductor material into the Silicon Carbide substrate at a separation plug depth level, and is configured to block the coupling between at least two adjacent active/passive structures formed in the Silicon semiconductor material.

20 Claims, 4 Drawing Sheets

HIGH PERFORMANCE ACTIVE AND PASSIVE STRUCTURES BASED ON SILICON MATERIAL BONDED TO SILICON CARBIDE

This is the continuation-in-part for the patent application Ser. No. 10/078,588, filed on Feb. 14, 2002 now abandoned, and entitled "HIGH PERFORMANCE ACTIVE AND PASSIVE STRUCTURES BASED ON SILICON MATERIAL GROWN EPITAXIALLY OR BONDED TO SILICON CARBIDE SUBSTRATE".

BACKGROUND OF THE INVENTION

1. Field of the Invention

The present invention is in the field of Silicon fabricated integrated circuits (ICs). More specifically, the present invention relates to Silicon fabricated ICs based on Silicon material grown epitaxially or bonded to Silicon Carbide (SiC) substrate in order to improve the heat dissipation of Silicon fabricated ICs while retaining the advantages of easiness of processing that the mature Silicon technology provides in order to compete with ICs fabricated on more exotic materials, such as Silicon Carbide.

2. Discussion of the Prior Art

In the prior art, there are various possibilities for growing and/or bonding Silicon Carbide (SiC) to Silicon (Si), however none for growing Silicon or bonding it to Silicon Carbide.

Nagasawa H. et al. in the paper entitled "3C—SiC Monocrystal Grown on Undulant Si (001) Substrates", and published in Mat. Res. Soc. Symp. Proc., Vol. 742, on page 47, disclose the technique for growing SiC on Silicon substrates scrapped by diamond slurry and oxidized to promote undulations. According to Nagasaki technique, at first, a thin layer on the top surface of the "sacrificial" Silicon sample is carbonized to convert it to SiC. At the next step, an epi SiC layer of the desired thickness could be grown on top of the thin layer of SiC. The "sacrificial" Silicon sample is removed at the final step. This is the process used by the HOYA Advanced Semiconductor Technologies Company to produce SiC substrates up to 6 inches in diameter.

Another technique developed by the SOITEC company was described in the paper entitled "A New Process for the Fabrication of SiC Power Devices and Systems on SiCOI (Silicon Carbide On Insulator) Substrates", and published by Templier, F. et al. in Mat. Res. Soc. Symp. Proc., Vol. 742, on page 395. The author of this technique used low cost polycrystalline SiC substrate.

The implementation and usage of all these prior art techniques depends significantly on mastering at least the following material technologies: (a) SiC large area substrate fabrication; and (b) SiC bonding techniques.

All these efforts are a result of the increased interest on building electronic devices on Silicon Carbide material as a result of it's very attractive and superior to Silicon electrical properties, However, the fact is that presently Silicon Carbide material technology has great challenges ahead in fabricating high purity, defect free substrates suitable for the manufacture of electronic circuits.

The present invention relates to new high performance active and passive structures that are built on Silicon material grown or bonded to Silicon Carbide substrates to leverage the Silicon mature technology with the excellent thermal dissipation of the Silicon Carbide substrates manufactured by one of the prior art processes described above or others. In the present invention the electrical quality of the Silicon Carbide substrate is of negligible importance and it can be single crystal or polycrystalline as long as it's thermal properties are substantial.

SUMMARY OF THE INVENTION

To address the shortcomings of the available art, the present invention provides for the fabrication of high performance active and passive structures based on Silicon material grown epitaxially or bonded to Silicon Carbide substrates.

One aspect of the present invention is directed to a Silicon Carbide based Silicon structure including a bonding layer.

In one embodiment of the present invention, the Silicon Carbide based Silicon structure comprises: (1) a Silicon Carbide substrate; (2) a bonding layer overlying the Silicon Carbide substrate; and (3) a single crystal Silicon semiconductor material having a top surface. In this embodiment of the present invention, the single crystal Silicon semiconductor material is overlaying the bonding layer and is bonded to the Silicon Carbide substrate via the bonding layer.

In one embodiment of the present invention, the Silicon Carbide substrate having a first dopant concentration is of a conductivity type selected from the group consisting of: {a first conductivity type, and a second conductivity type}. In this embodiment of the present invention, the single crystal Silicon semiconductor material having a second dopant concentration is of a conductivity type selected from the group consisting of: {the first conductivity type, and the second conductivity type}. In one embodiment of the present invention, the first conductivity type is of N type; and the second conductivity is of P type. In another embodiment of the present invention, the first conductivity type is of P type; and the second conductivity is of N type.

In one embodiment of the present invention, the first dopant concentration of Silicon Carbide substrate is equal or greater than the second dopant concentration of the single crystal Silicon semiconductor material. In another embodiment of the present invention, the first dopant concentration of the Silicon Carbide substrate is lower than the second dopant concentration of the single crystal Silicon semiconductor material.

In one embodiment of the present invention, the Silicon Carbide substrate further includes a plurality of N Silicon Carbide layers. More specifically, in one embodiment of the present invention, the first Silicon Carbide layer includes a bottom surface of the Silicon Carbide substrate, the last N-th layer includes a top surface of the Silicon Carbide substrate, each subsequent "k"-th layer is overlying the preceding "k−1"-th layer, each subsequent "k"-th Silicon Carbide layer is grown on the preceding "k−1"-th Silicon Carbide layer. In one embodiment of the present invention, each "k"-th Silicon Carbide layer having a "k"-th dopant concentration includes a "k"-th conductivity type selected from the group consisting of: {the first conductivity type, and the second conductivity type}. "K" is an integer greater than 1, and less or equal to an integer N.

In one embodiment of the present invention, at least one "k"-th Silicon Carbide layer further comprises an epitaxially grown by a Chemical Vapor Deposition (CVD) process Silicon Carbide layer, or an epitaxially grown by a molecular beam epitaxy (MBE) process Silicon Carbide layer.

In one embodiment of the present invention, the single crystal Silicon semiconductor material further includes a plurality of M single crystal Silicon semiconductor material layers. More specifically, in one embodiment of the present invention, the first single crystal Silicon semiconductor material layer includes a bottom surface of the single crystal Silicon semiconductor material, the last M-th layer includes a top surface of the single crystal Silicon semiconductor material, and each subsequent "i"-th layer having an "i"-th dopant concentration being grown on, and is overlying, the preceding "i−1"-th layer; each "i"-th single crystal Silicon semiconductor material layer having an "i"-th conductivity type selected from the group consisting of: {the first conductivity type, and the second conductivity type}; "i" is an integer greater than 1 and less or equal to integer M.

In one embodiment of the present invention, at least one "i"-th single crystal Silicon semiconductor material layer further comprises an epitaxially grown by a Chemical Vapor Deposition (CVD) process single crystal Silicon semiconductor material layer, or an epitaxially grown by a molecular beam epitaxy (MBE) process single crystal Silicon semiconductor material layer.

In one embodiment of the present invention, the bonding layer further comprises: a Silicon dioxide layer. In another embodiment of the present invention, the bonding layer further comprises: a Silicon layer. In one more embodiment of the present invention, the bonding layer further comprises a carbon layer. In one additional embodiment of the present invention, the bonding layer further comprises a Silicon germanium (SiGe) layer. Yet, in one more embodiment of the present invention, the bonding layer further comprises a metal silicided layer selected from the group consisting of: {a tungsten silicide layer; a titanium silicide layer; and a cobalt silicide layer}.

In one embodiment, the structure of the present invention further includes: at least one separation plug formed in the Silicon semiconductor material. The separation plug extends from the top surface of the Silicon semiconductor material into the Silicon Carbide substrate at a separation plug depth level. The separation plug is configured to block the coupling between at least two adjacent active/passive structures formed in the Silicon semiconductor material. The first active/passive structure extends from the top surface of the Silicon semiconductor material into the Silicon semiconductor material at a first active/passive structure depth level, and the second active/passive structure extends from the top surface of the Silicon semiconductor material into the Silicon semiconductor material at a second active/passive structure depth level.

In one embodiment of the present invention, the separation plug further includes: a trench filled with a material selected from the group consisting of: {an oxide material, polySilicon material, a metal material, a silicided material, a tungsten silicide material, a titanium silicide material, a cobalt silicide material, and a platinum silicide material}.

Another aspect of the present invention is directed to a Silicon Carbide based Silicon structure comprising: (1) a Silicon Carbide substrate; (2) a double bonding layer overlying the Silicon Carbide substrate; and (3) a single crystal Silicon semiconductor material having a top surface. In one embodiment of the present invention, the single crystal Silicon semiconductor material is overlaying the double bonding layer and is bonded to the Silicon Carbide substrate via the double bonding layer.

In one embodiment of the present invention, the double bonding layer further comprises: a Silicon dioxide layer, and a Silicon germanium (SiGe) layer. In this embodiment, the Silicon Carbide substrate is attached to the Silicon dioxide layer, and the single crystal Silicon semiconductor material is attached to the Silicon germanium (SiGe) layer.

In one embodiment of the present invention, the double bonding layer further comprises: a carbon layer, and a Silicon germanium (SiGe) layer. In this embodiment, the Silicon Carbide substrate is attached to the carbon layer, and the single crystal Silicon semiconductor material is attached to the Silicon germanium (SiGe) layer.

In one embodiment of the present invention, the double bonding layer further comprises: a metal silicided layer, and a Silicon germanium (SiGe) layer. In this embodiment, the Silicon Carbide substrate is attached to the metal silicided layer, the single crystal Silicon semiconductor material is attached to the Silicon germanium (SiGe) layer, and the metal silicided layer is selected from the group consisting of: a tungsten silicide layer; a titanium silicide layer; and a cobalt silicide layer.

Yet, one more aspect of the present invention is directed to a Silicon Carbide based Silicon structure. In one embodiment of the present invention, the Silicon Carbide based Silicon structure comprises: (1) a Silicon Carbide substrate; and (2) a single crystal Silicon semiconductor material having a top surface. In this embodiment of the present invention, the single crystal Silicon semiconductor material is grown on the Silicon Carbide substrate.

BRIEF DESCRIPTION OF DRAWINGS

The aforementioned advantages of the present invention as well as additional advantages thereof will be more clearly understood hereinafter as a result of a detailed description of a preferred embodiment of the invention when taken in conjunction with the following drawings.

DETAILED DESCRIPTION OF THE PREFERRED AND ALTERNATIVE EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Figure 1A:
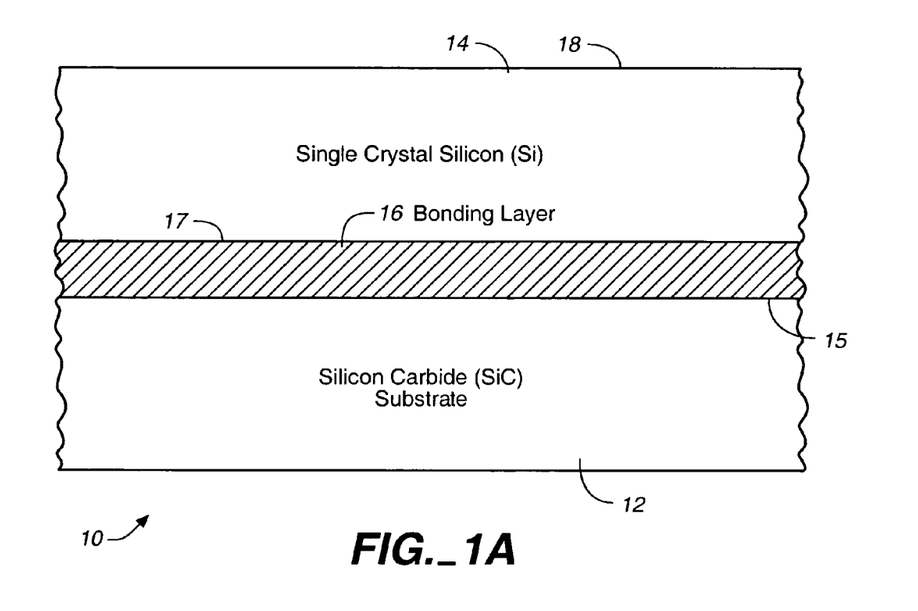
FIG. 1A depicts a Silicon Carbide based Silicon structure of the present invention comprising a Silicon Carbide substrate, a bonding layer overlying the Silicon Carbide substrate, and a single crystal Silicon semiconductor material overlying the bonding layer and having a top surface.

In one embodiment of the present invention, FIG. 1A depicts a Silicon Carbide based Silicon structure 10 comprising a Silicon Carbide substrate 12; a bonding layer 16 overlying the Silicon Carbide substrate 12, and a single crystal Silicon semiconductor material 14 having a top surface 18. The single crystal Silicon semiconductor material 14 is overlaying the bonding layer 16 and is bonded to the Silicon Carbide substrate 12 via the bonding layer 16.

In one embodiment of the present invention, the Silicon Carbide substrate 12 having a first dopant concentration $(N/P)_{SiC}^{I}$ is of a conductivity type $(SiC)^{I,II}$ selected from the group consisting of: {a first conductivity type, and a second conductivity type}. In this embodiment of the present invention, the single crystal Silicon semiconductor material 14 having a second dopant concentration $(N/P)_{Si}^{II}$ is of a conductivity type $(Si)^{I,II}$ selected from the group consisting of: {the first conductivity type, and the second conductivity type}.

In one embodiment of the present invention, the first conductivity type is of N type, that is the majority carriers are electrons and the second conductivity is of P type, that is the majority carriers are holes. In another embodiment of the present invention, the first conductivity type is of P type; and the second conductivity is of N type.

In one embodiment, the single crystal Silicon semiconductor material is doped to be N-type by using ions of Arsenic, or ions of Phosphorous. In another embodiment, the single crystal Silicon semiconductor material is doped to be P-type by using ions of Boron. In one embodiment, the SiC substrate is doped to be N type by using ions of Nitrogen. In another embodiment, the SiC substrate is doped to be P type by using ions of Aluminum.

Referring still to FIG. 1A, in one embodiment of the present invention, the dopant concentration $(N/P)_{SiC}^{I/II}$ of the Silicon Carbide substrate is equal or greater than the dopant concentration $(N/P)_{Si}^{I/II}$ of the single crystal Silicon semiconductor material:

$$(N/P)_{SiC}^{I/II} \geq (N/P)_{Si}^{I/II}. \quad (1)$$

In another embodiment of the present invention, the dopant concentration $(N/P)_{SiC}^{I/II}$ of the Silicon Carbide substrate is less than the dopant concentration $(N/P)_{Si}^{I/II}$ of the single crystal Silicon semiconductor material:

$$(N/P)_{SiC}^{I/II} < (N/P)_{Si}^{I/II}. \quad (2)$$

Referring still to FIG. 1A, in one embodiment of the present invention, the bonding layer 16 comprises a Silicon dioxide bonding layer. In one embodiment, a thin layer (500 Å-5000 Å) of crystalline Silicon dioxide 16 is grown by oxidizing both the SiC top surface 15 and the Silicon bottom surface 17, or by deposition of a thin (500 Å-2000 Å) layer of crystalline Silicon dioxide to the bonding surfaces 16 and 17.

In another embodiment, the bonding layer 16 comprises a Silicon layer. In one more embodiment, the bonding layer 16 further comprises a carbon layer.

Yet, in one additional embodiment, the bonding layer 16 further comprises a metal silicided layer including a tungsten silicide layer, a titanium silicide layer, or a cobalt silicide layer. The thickness of bonding layer is typically in the range of (50-2000) Å.

In one additional embodiment of the present invention, the bonding layer further comprises a Silicon germanium (SiGe) layer. The (SiGe) layer is capable of creating a layer of "strained crystalline Silicon" that is located in close proximity to the bonding (SiGe) layer.

Strained silicon is one of those rare new technologies that enables a fairly dramatic increase in performance with a relatively simple change in starting materials. Proof that transistors fabricated with strained silicon were faster due to increased electron mobility and velocity was first demonstrated in the mid-1980s. Then, in 1998, researchers showed it would work with leading-edge, sub-100 nm short-channel transistors. Today, companies such as Intel, IBM, Hitachi, AMD and UMC have reported success with strained silicon.

From the microscopic point of view, Strained silicon stretches the distances between the silicon atoms in transistors, the tiny on/off switches that form the basis of a chip. Moving these atoms slightly farther apart reduces the atomic forces that interfere with the movement of electrons through the transistors, leading to better performance, increased carrier mobility, and lower energy consumption for the chip. Strained silicon works by growing a thin layer of silicon on top of a layer of silicon germanium. The atoms in the silicon layer align with those in the slightly larger crystalline lattice of the SiGe (germanium atoms are larger than silicon). This increase in spacing between the silicon atoms is enough to change how electrons are shared between the atoms, basically redefining how energy is shared in the conduction bands of the material. The result is increased electron mobility in NMOS devices and, to a lesser extent, increased hole mobility in PMOS devices. This leads to an increase in channel drive current and also some reductions in power consumption. The amount of strain that is applied to silicon affects holes and electrons differently. The electrons benefit at a much greater rate than holes do. For the wafers based on the first-generation strained silicon technology, 25-30% improvement in NMOS and 5-10% enhancement of PMOS are expected.

In strained Silicon, the atoms can be stretched (1) by inserting germanium atoms into the chip's silicon lattice, or (2) by adding a layer of silicon-germanium into the transistor bed. These two technologies are conceptually related, but different, so that they can be used in the same chip. The use of strained Silicon raises chip manufacturing costs by 1 or 2 percent for a performance gain of 10 percent to 20 percent.

If Si is placed on SiGe, which has a slightly wider lattice spacing than Si, then it is stretched (strained), and mobility is increased. A strained-Si transistor is fabricated on a Si layer deposited on a substrate containing SiGe, and uses this strained layer as the channel layer (the layer through which electrons flow). In addition, as a result of planarizing the SiGe layer by chemical mechanical polishing (CMP), it was possible to minimize the performance degradation due to surface roughness, and to achieve a 2.2-fold increase in mobility as compared to conventional Si-MOS transistors. This result demonstrates the advantage of the strained-Si transistors over the Si transistors to realize ultrahigh-speed CMOS.

Hitachi developed the strained-Si technology of growing the strained-Si layer on a planarized Si—Ge layer surface to achieve full performance expected in strained-Si. Features of the technology are as follows:

(1) CMP was introduced as a planarization process of the SiGe layer, and surface roughness was reduced to an atomic level flatness of 0.4 nm.

(2) A chemical vapor deposition technique was developed to re-grow the strained-Si layer after Chemical Mechanical Polishing (CMP) on the planarized SiGe layer. (CMP is a technique to smoothen surfaces by polishing both chemically and mechanically using a slurry containing alkaline solution and polishing medium).

(3) The heat-treatment temperature was optimized to minimize performance degradation during the transistor fabrication process, due to diffusion of Ge from the SiGe layer to the strained-Si layer and strain relaxation of the strained-Si layer.

Using this technology, MOS transistors with a channel length of 0.24 m were fabricated. Both electron and hole mobilities were found to have increased by +120% and 42% over the conventional Si transistors, respectively. The current drive was found to have significantly improved by, +70% for the − channel, and 51% for the P-channel, over the conventional Si-MOS devices. This result shows that the strained-Si technology is indeed a viable candidate for next-generation high-speed CMOS technology.

At the 2003 Symposia of VLSI Technology and Circuits, held in June in Kyoto, Japan, both AMD and UMC co-authored papers with AmberWave Systems (Salem, N.H.), a company that is licensing strained silicon technology. AMD made transistors down to 25 nm physical gate length, which should be sufficient for 65 nm node technology; whereas UMC was focused on 130 nm node and 90 nm node technology. Both companies are using the first-generation strained silicon technologies. The difference between the first- and the second-generation strained silicon technologies is largely the amount of germanium that's used. AmberWave has developed a process that employs a compositionally graded series of layers of SiGe, with varying germanium concentration. By gradually expanding the crystal lattice beyond that of silicon, dislocations are carefully controlled and confined to the SiGe buffer layer. Higher levels of germanium require more complicated buffer layers to reduce defects, but result in higher electron and hole mobilities.

Referring still to FIG. 1A, a carbon bonding layer 16 can be formed by using the CVD process, or by performing the selective etching of the top surface 15 of the SiC substrate 12 to remove small amounts of Silicon while leaving the carbon exposed, or by combination of both processes wherein Silicon is etched from the bonding SiC surface 15 and carbon is deposited by CVD on the Silicon surface 17 to be bonded to the SiC substrate 12.

In one embodiment, the Silicon bonding layer can be formed by using a Chemical Vapor Deposition (CVD) process. The chemical vapor deposition (CVD) process is the process in which a film is deposited by a chemical reaction or decomposition of a gas mixture at elevated temperature at the wafer surface or in its vicinity. The typical examples of CVD films are a single crystal Silicon film, a polycrystalline Silicon film, a crystalline Silicon dioxide film, a Silicon-nitride film, or a SiC film. CVD can be performed at atmospheric pressure (APCVD), or at low pressure (LPCVD).

In one of the typical applications of epitaxial deposition, a lightly doped layer is deposited on a heavily doped substrate. The lightly doped layer is the region where active devices are constructed and the heavily doped substrate constitutes a low resistance circuit path.

In another typical application of epitaxial deposition, heavily doped layer is buried in a lightly doped region of opposite polarity. The heavily doped layer is first defined and formed in the substrate using lithography, etching, and doping techniques. For the complete reference, please, see "Fundamentals of Semiconductor Processing Technologies" by Badih El-Kareh, IBM Corporation, published by Kluwer Academic Publishers in 1995.

The epi layer can be intentionally doped while grown by adding controlled amounts of the dopant compounds to the gas stream. Typical dopant sources are hybrids of the impurity, such as phosphine ($PH_3$), arsine ($AsH_3$), antimonine ($SbH_3$), or diborane ($B_2H_6$).

Referring still to FIG. 1A, a tungsten silicide bonding layer can be deposited by using sputtering or by using the CVD process. A titanium silicide bonding layer, or a cobalt silicide layer can be formed by sputtering.

Sputtering is similar to a billiard-ball event. Ions are accelerated in an electric field toward a target of material to be deposited, where they "knock-off" (sputter) target atoms. The sputtered ions then deposited onto wafers which are conveniently placed facing the target. Argon ion (Ark) is typically used for sputtering because it is inert and readily available in a pure form. It is ionized by colliding with high energy electrons in the chamber, and then accelerated in an electric field toward the negatively biased target. The momentum of ions incident on the target is then transferred to the surface atoms of the target material, causing ejection. Therefore, during sputter deposition, material is removed from the target and deposited onto wafers.

Figure 1B:
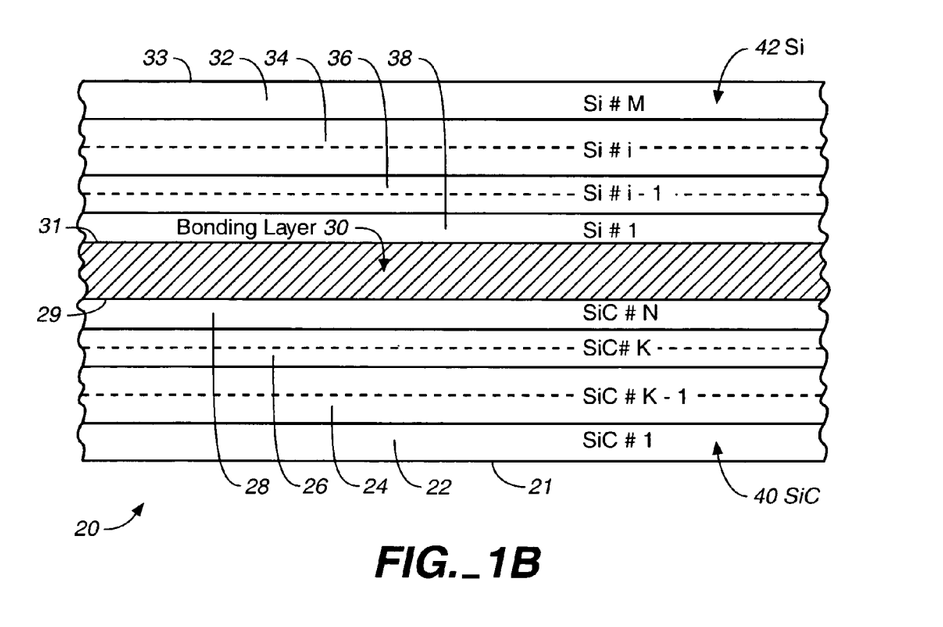
FIG. 1B shows a Silicon Carbide based Silicon structure of the present invention comprising the Silicon Carbide substrate further including a plurality of N Silicon Carbide layers, a bonding layer overlying the Silicon Carbide substrate, and a single crystal Silicon semiconductor material further including a plurality of M crystalline Silicon layers, N and M are integers.

In one embodiment of the present invention, FIG. 1B shows a Silicon Carbide based Silicon structure of the present invention 20 comprising the Silicon Carbide substrate 40 further including a plurality of N Silicon Carbide layers (22, 24, 26, . . . , 28), a bonding layer 30 overlying the Silicon Carbide substrate 40, and a single crystal Silicon semiconductor material 42 further including a plurality of M crystalline Silicon layers (38, 36, 34, . . . , 32), N and M are integers. The first Silicon Carbide layer 22 includes the bottom surface of the Silicon Carbide substrate 21. The last N-th Silicon Carbide layer 28 includes a top surface 29 of the Silicon Carbide substrate 40. Each subsequent "k"-th layer 26 is overlying the preceding "k−1"-th layer 24.

Referring still to FIG. 1B, in one embodiment of the present invention, each "k"-th Silicon Carbide layer 26 includes a "k"-th conductivity type comprising the first conductivity type $(SiC)^I_k$, or the second conductivity type $(SiC)^{II}_k$, wherein "k" is an integer greater than one and less or equal to N. Each "k"-th Silicon Carbide layer includes a "k"-th dopant concentration $(N/P)_{SiC}^I$, or $(N/P)_{SiC}^{II}$.

Each subsequent "k"-th Silicon Carbide layer 26 is grown on the preceding "k−1"-th Silicon Carbide layer 24. In one embodiment, at least one Silicon Carbide layer further comprises an epitaxially grown by CVD process Silicon Carbide layer, or an epitaxially grown by a molecular beam epitaxy (MBE) process Silicon Carbide layer. The epi layer can be intentionally doped while grown by adding controlled amounts of the dopant compounds to the gas stream.

Example I

The epi layer #1 of SiC 22, about 0.1-3 microns thick, is grown on the bottom SiC surface 21 of the SiC substrate 40.

As was stated above, in one embodiment, at least one Silicon Carbide layer further comprises an epitaxially grown by a molecular beam epitaxy (MBE) process Silicon Carbide layer.

Molecular beam epitaxy (MBE) is a sophisticated deposition technique performed in ultra high vacuum to grow compound semiconductors. High performance electronic, optoelectronic and photonic devices usually involve complex semiconductor heterostructure layers, and should be produced by advanced thin-film growth techniques such as MBE. In MBE, atoms of an element or compound are delivered to a substrate through an ultra-pure, ultra-high vacuum (UHV) atmosphere. The UHV atmosphere provided by the MBE chamber allows the atoms to arrive on the substrate without colliding with other atoms or molecules. This keeps the growth free of other contaminants. The heated substrate surface allows the arriving atoms to distribute themselves evenly across the surface to form an almost perfect crystal structure.

In MBE the substrate is placed in an UHV chamber with direct line of sight to several elemental species, each of which is in an evaporation furnace commonly referred to as an effusion cell. Through use of shutters and precise control of the effusion cell temperatures almost any material composition and doping can be achieved. Further, the composition may be controlled with a resolution of virtually one atomic layer. Applied Epi, formerly EPI MBE Products Group, based in St. Paul, Minn., USA, is a leader in MBE, and manufactures the GEN 2000™-designed to mass-produce epitaxial wafers.

Referring still to FIG. 1B, the Silicon Carbide based Silicon structure 20 further includes a plurality of M single crystal Silicon semiconductor material layers (38, 36, . . . , 34, 32). The first single crystal Silicon semiconductor material layer 38 includes the bottom surface 31 of the single crystal Silicon semiconductor material 42; wherein the last M-th layer 32 includes the top surface 33 of the single crystal Silicon semiconductor material 42. Each subsequent "i"-th layer 34 is overlying the preceding "i–1"-th layer 36. Herein, "i" is an integer greater than 1 and less or equal to M, M is an integer.

Referring still to FIG. 1B, in one embodiment of the present invention, each "i"-th crystalline Silicon layer 34 includes the "i"-th conductivity type comprising the first conductivity type (Si)$^I$ or the second conductivity type (Si)$^{II}_i$. Each "i"-th crystalline Silicon layer includes an "i"-th dopant concentration (N/P)$_{Si}^I$, or (N/P)$_{Si}^{II}$.

At least one "i"-th single crystal Silicon semiconductor material layer further comprises an epitaxially grown by CVD process single crystal Silicon semiconductor material layer, or an epitaxially grown by MBE process single crystal Silicon semiconductor material layer. Please, see discussion above.

Example II

The epi Si layer #1 38, about 0.02-5 microns thick, is grown on the top surface 31 of the bonding layer 30 in the presence of diborane (B$_2$H$_6$). This process results in a lightly Boron doped (P$^-$) epi crystalline Silicon layer #1 38.

Figure 2:
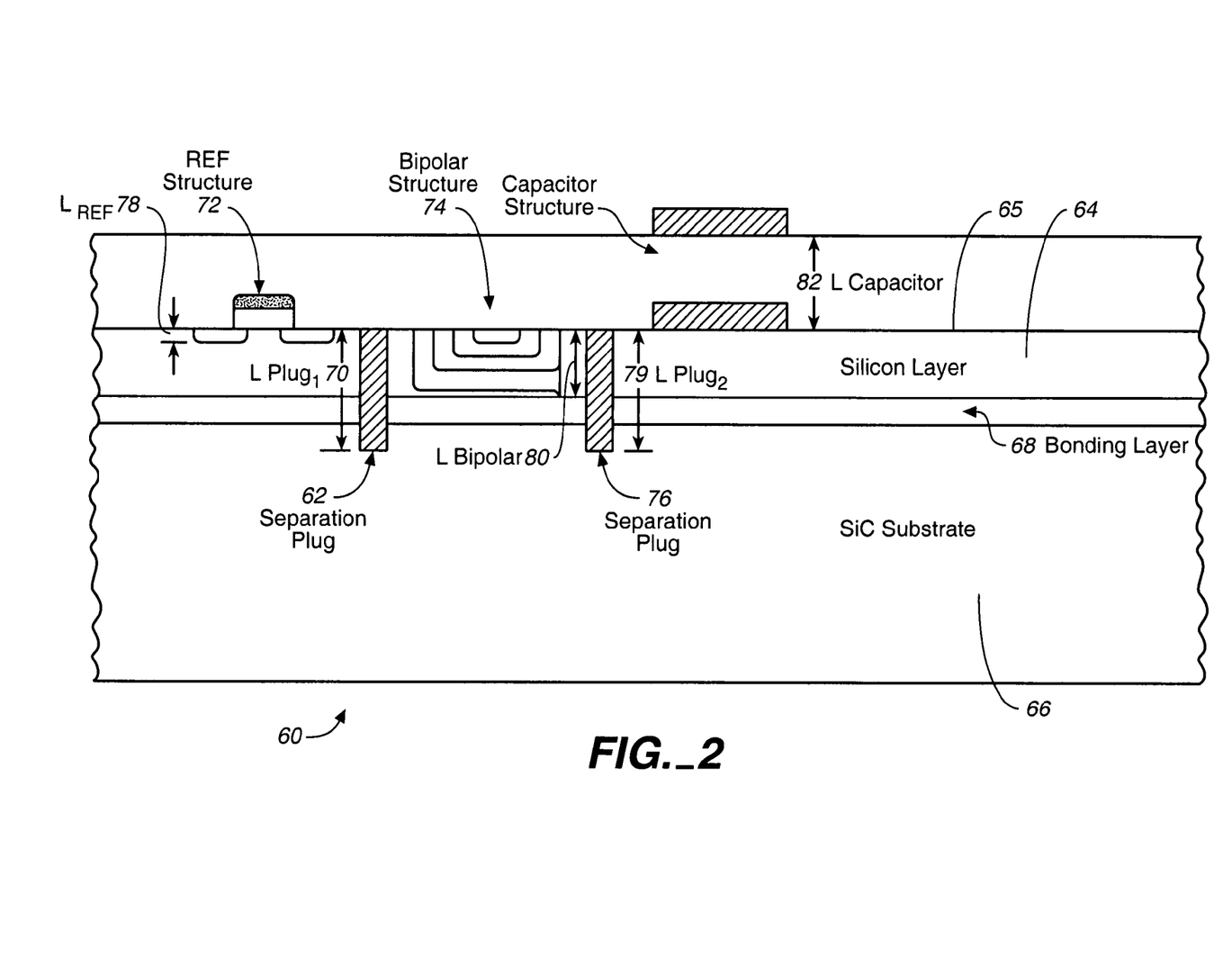
FIG. 2 illustrates a Silicon Carbide based Silicon structure of FIG. 1A further including at least one separation plug configured to block the coupling between at least two adjacent active/passive structures.

In one embodiment of the present invention, as depicted in FIG. 2, the Silicon Carbide based Silicon structure 60 further includes at least one separation plug 62 formed in the single crystal Silicon semiconductor material 64. The separation plug 62 extends from the top surface 65 of the single crystal Silicon semiconductor material 64 into the Silicon Carbide substrate 66 at a separation plug depth level L$_{Plug}$ (not shown). In general, each separation plug is configured to block the coupling between at least two adjacent active/passive structures, wherein the first active/passive structure extends from the top surface 65 of the single crystal Silicon semiconductor material 64 into the single crystal Silicon semiconductor material 64 at a first active/passive structure depth level (not shown), and wherein the second active/passive structure L$_{First\ active/passive}$ extends from the top surface 65 of the single crystal Silicon semiconductor material 64 into the single crystal Silicon semiconductor material 64 at a second active/passive structure depth level L$_{Second\ active/passive}$ (not shown).

In one embodiment of the present invention, as illustrated in FIG. 2, the first separation plug 62 extended at the separation plug depth level L$_{Plug1}$ 70 separates the FET structure 72 extended at the FET structure depth level L$_{FET}$ 78 from the bipolar structure 74 extended at the bipolar structure depth level L$_{Bipolar}$ 80, and the second separation plug 76 extended at the separation plug depth level L$_{Plug2}$ 79 separates the bipolar structure 74 extended at the bipolar structure depth level L$_{Bipolar}$ 80 from the capacitor structure 78 extended at the capacitor structure depth level L$_{Capacitor}$ 82.

In this embodiment, as shown in FIG. 2, the separation plug depth level L$_{Plug1}$ of the first plug 62 is deeper than the FET structure depth level L$_{FET}$ 78 and is deeper than the bipolar structure depth level L$_{Bipolar}$ 80:

$$L_{Plug1} > L_{FET}; \tag{3}$$

$$L_{Plug1} > L_{Bipolar}. \tag{4}$$

Similarly, in this embodiment, as shown in FIG. 2, the separation plug depth level L$_{Plug2}$ of the second plug 76 is deeper than the bipolar structure depth level L$_{Bipolar}$ 80 and is deeper than the capacitor structure depth level L$_{Capacitor}$ 82:

$$L_{Plug2} > L_{Bipolar}; \tag{5}$$

$$L_{Plug2} > L_{Capacitor}. \tag{6}$$

In one embodiment, the separation plug 62 further includes a trench (not shown) filled with a material comprising: an oxide material, a polySilicon material, a metal material, a silicided material, a tungsten silicide material, a titanium silicide material, a cobalt silicide material, or a platinum silicide material.

Figure 3A:
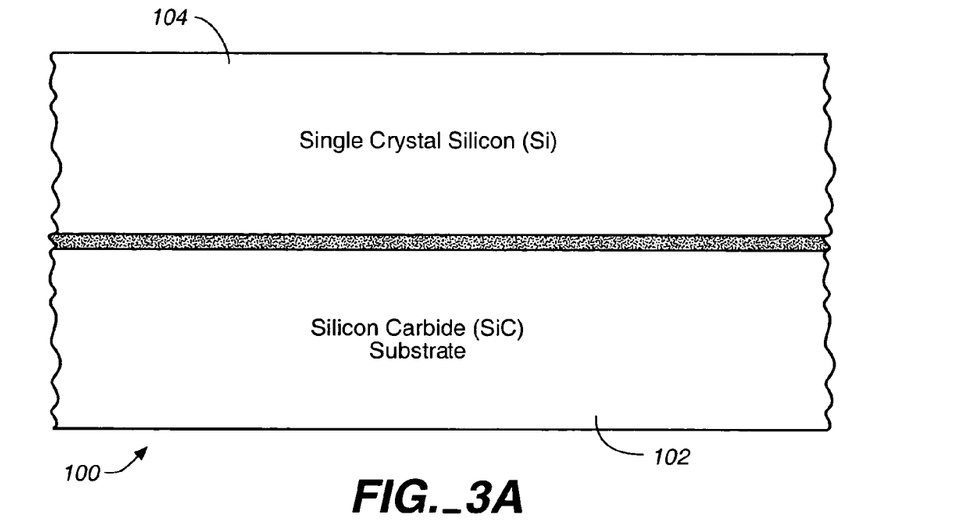
FIG. 3A depicts a Silicon Carbide based Silicon structure of the present invention comprising a Silicon Carbide substrate and a single crystal Silicon semiconductor material grown on the Silicon Carbide substrate and having a top surface.

In one embodiment of the present invention, FIG. 3A illustrates a Silicon Carbide based Silicon structure 100 further comprising a Silicon Carbide substrate 102, and a single crystal Silicon semiconductor material 104 having a top surface 106. In this embodiment, the single crystal Silicon semiconductor material 104 is epitaxially grown on the Silicon Carbide substrate 102.

In one embodiment of the present invention, the Silicon Carbide substrate 102 is of a first conductivity type (SiC)$^I$ and includes a first dopant concentration (N/P)$_{SiC}^I$; wherein the single crystal Silicon semiconductor material 104 is of a second conductivity type (Si)$^{II}$ and has a second dopant concentration (N/P)$_{Si}^{II}$.

In one embodiment, the conductivity type of the Silicon Carbide (SiC)$^I$ is of P type, that is the majority carriers in the Silicon Carbide substrate are holes. In another embodiment, the conductivity type of the Silicon Carbide (SiC)$^I$ is of N type, that is the majority carriers in the Silicon Carbide substrate are electrons. In one embodiment, the conductivity type of the single crystal Silicon semiconductor material (Si)$^{II}$ is of P type, that is the majority carriers in the single crystal Silicon semiconductor material are holes. In one more embodiment, the conductivity type of the single crystal Silicon semiconductor material $(Si)^{II}$ is of N type, that is the majority carriers in the single crystal Silicon semiconductor material are electrons.

As was stated above, the single crystal Silicon semiconductor material 104 can be doped to be N-type by using ions of Arsenic, or ions of Phosphorous, or can be doped to be P-type by using ions of Boron, whereas the SiC substrate 102 can be doped to be N type by using ions of Nitrogen, or can be doped to be P type by using ions of Aluminum.

Referring still to FIG. 3A, in one embodiment of the present invention, the dopant concentration $(N/P)_{SiC}^{I/II}$ of the Silicon Carbide substrate is equal or greater than the dopant concentration $(N/P)_{SiC}^{I/II}$ of the single crystal Silicon semiconductor material, according to Eq. (1). In another embodiment of the present invention, the dopant concentration $(N/P)_{SiC}^{I/II}$ of the Silicon Carbide substrate is less than the dopant concentration $(N/P)_{Si}^{I/II}$ of the single crystal Silicon semiconductor material, according to Eq. (2).

Figure 3B:
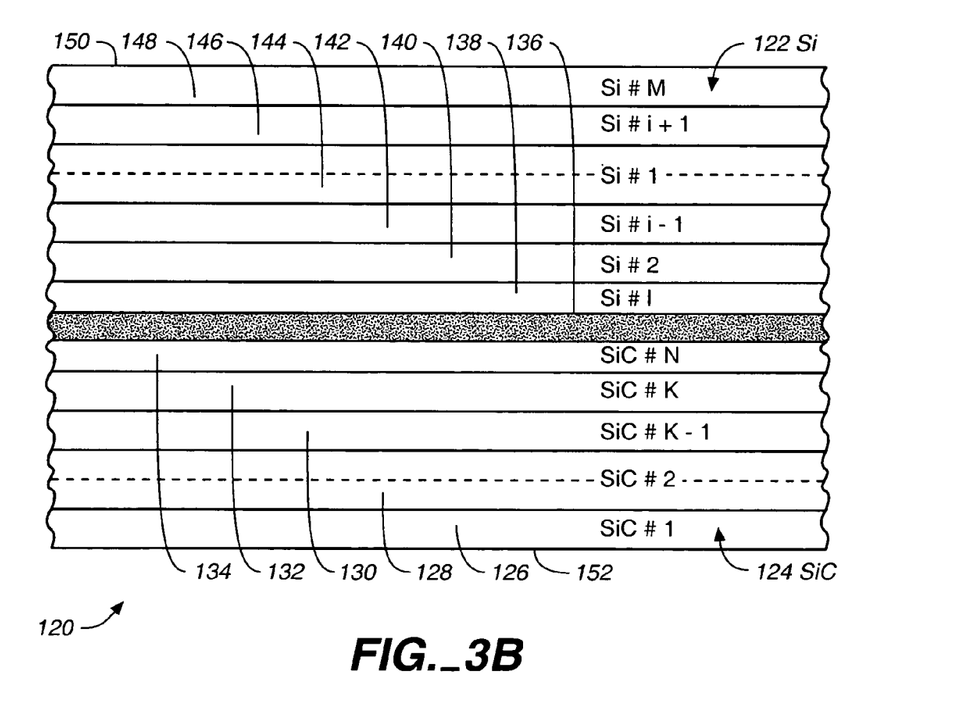
FIG. 3B shows a Silicon Carbide based Silicon structure of the present invention comprising the Silicon Carbide substrate further including a plurality of N Silicon Carbide layers, and a single crystal Silicon semiconductor material further including a plurality of M crystalline Silicon layers, N and M are integers.

In one embodiment of the present invention, FIG. 3B shows a Silicon Carbide based Silicon structure of the present invention 120 comprising the Silicon Carbide substrate 124 further including a plurality of N Silicon Carbide layers (126, 128, 130, 132, ..., 134), and a single crystal Silicon semiconductor material 122 further including a plurality of M crystalline Silicon layers (142, 144, 146, ..., 148), N and M are integers. The first Silicon Carbide layer 126 includes the bottom surface of the Silicon Carbide substrate 152. The last N-th Silicon Carbide layer 134 includes a top surface 136 of the Silicon Carbide substrate 124. Each subsequent "k"-th layer 132 is overlying the preceding "k−1"-th layer 130.

Referring still to FIG. 3B, in one embodiment of the present invention, each "k"-th Silicon Carbide layer 132 includes a "k"-th conductivity type comprising the first conductivity type $(SiC)_k^I$, or the second conductivity type $(SiC)_k^{II}$, wherein "k" is an integer greater than one and less or equal to N. Each "k"-th Silicon Carbide layer includes a "k"-th dopant concentration $(N/P)_{SiC}^I$, or $(N/P)_{SiC}^{II}$.

Each subsequent "k"-th Silicon Carbide layer 132 is grown on the preceding "k−1"-th Silicon Carbide layer 130. In one embodiment, at least one Silicon Carbide layer further comprises an epitaxially grown by CVD process Silicon Carbide layer, or an epitaxially grown by a molecular beam epitaxy (MBE) process Silicon Carbide layer. (Please, see discussion above).

Referring still to FIG. 3B, the Silicon Carbide based Silicon structure 122 further includes a plurality of M single crystal Silicon semiconductor material layers (138, 140, 142, 144, ..., 146, 148). The first single crystal Silicon semiconductor material layer 138 includes the bottom surface 136 of the single crystal Silicon semiconductor material 122; wherein the last M-th layer 148 includes the top surface 150 of the single crystal Silicon semiconductor material 122. Each subsequent "i"-th layer 144 is overlying the preceding "i−1"-th layer 142. Herein, "i" is an integer greater than 1 and less or equal to M, M is an integer.

Referring still to FIG. 3B, in one embodiment of the present invention, each "i"-th crystalline Silicon layer 144 includes the "i"-th conductivity type comprising the first conductivity type $(Si)_i^I$, or the second conductivity type $(Si)_i^{II}$. Each "i"-th crystalline Silicon layer includes an "i"-th dopant concentration $(N/P)_{Si}^I$, or $(N/P)_{Si}^{II}$.

At least one "i"-th single crystal Silicon semiconductor material layer further comprises an epitaxially grown by CVD process single crystal Silicon semiconductor material layer, or an epitaxially grown by MBE process single crystal Silicon semiconductor material layer. Please, see discussion above.

In one embodiment of the present invention, the Silicon Carbide based Silicon structure of FIG. 3A further includes at least one separation plug (not shown) formed in the single crystal Silicon semiconductor material 104 and extending into the SiC substrate 102. The complete description of this embodiment can be found from the given above description of the Silicon Carbide based Silicon structure of FIG. 1A further including at least one separation plug, as illustrated by structure 60 of FIG. 2. This above given disclosure is fully applicable herein and is incorporated by reference.

Figure 4A:
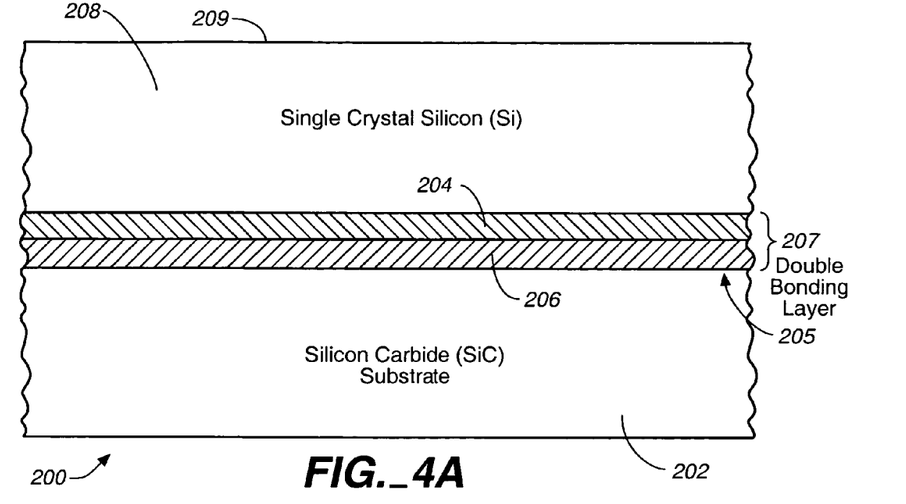
FIG. 4A depicts a Silicon Carbide based Silicon structure of the present invention comprising: (1) a Silicon Carbide substrate; (2) a double bonding layer overlying the Silicon Carbide substrate; and (3) a single crystal Silicon semiconductor material having a top surface.

Another aspect of the present invention is directed to a Silicon Carbide based Silicon structure 200 comprising: a Silicon Carbide substrate 202, a double bonding layer 207 overlying the Silicon Carbide substrate 202; and (3) a single crystal Silicon semiconductor material 208 having a top surface 209, as depicted in FIG. 4A.

In one embodiment of the present invention, the single crystal Silicon semiconductor material 208 is overlaying the double bonding layer 207 and is bonded to the Silicon Carbide substrate 202 via the double bonding layer 207.

In one embodiment of the present invention, the double bonding layer 207 further comprises: a Silicon dioxide layer 206, and a Silicon germanium (SiGe) layer 204. In this embodiment, the Silicon Carbide substrate 202 is attached to the Silicon dioxide layer 206, and the single crystal Silicon semiconductor material 208 is attached to the Silicon germanium (SiGe) layer 204. In one embodiment, a thin layer (500 Å-5000 Å) of Silicon dioxide 206 is grown by oxidizing the SiC top surface (or bonding surface) 205, or by deposition of a thin (500 Å-2000 Å) layer of Silicon dioxide to the bonding surface 205. The thickness of (SiGe) layer is about 1000 Å.

In one embodiment of the present invention, the double bonding layer further comprises: a carbon layer 206, and a Silicon germanium (SiGe) layer 204. In this embodiment, the Silicon Carbide substrate 202 is attached to the carbon layer 206, and the single crystal Silicon semiconductor material 208 is attached to the Silicon germanium (SiGe) layer 204.

In one embodiment of the present invention, the double bonding layer 207 further comprises: a metal silicided layer 206, and a Silicon germanium (SiGe) layer 204. In this embodiment, the Silicon Carbide substrate 202 is attached to the metal silicided layer 206, the single crystal Silicon semiconductor material 208 is attached to the Silicon germanium (SiGe) layer 204. In one embodiment of the present invention, the metal silicided layer 206 is selected from the group consisting of: a tungsten silicide layer; a titanium silicide layer; and a cobalt silicide layer.

Figure 4B:
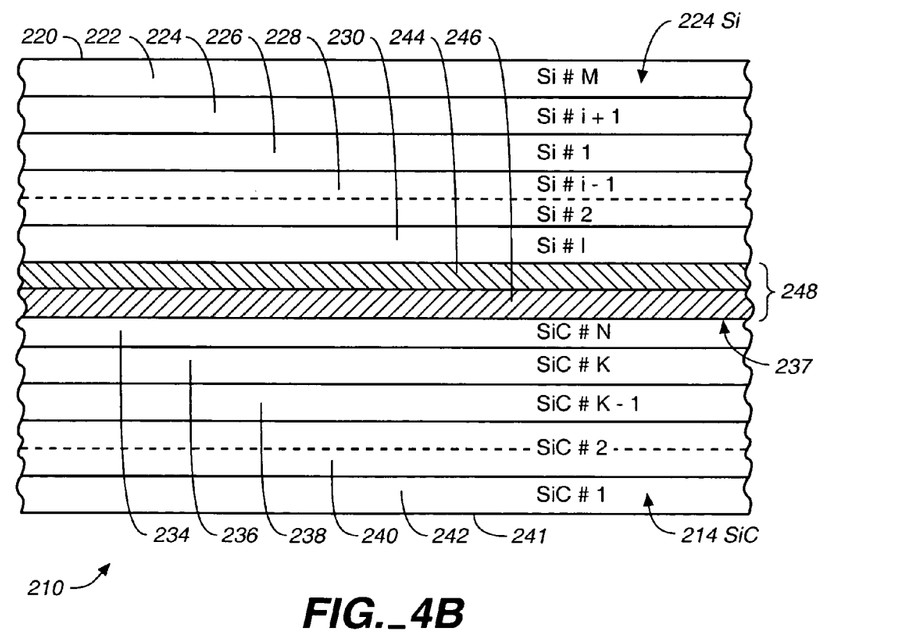
FIG. 4B shows a Silicon Carbide based Silicon structure of FIG. 4A including a Silicon Carbide substrate further including a plurality of N Silicon Carbide layers, a single crystal Silicon semiconductor material further including a plurality of M crystalline Silicon layers, and a double bonding layer, N and M are integers.

In one embodiment of the present invention, FIG. 4B shows a Silicon Carbide based Silicon structure of the present invention 210 further comprising the Silicon Carbide substrate 214 further including a plurality of N Silicon Carbide layers (242, 240, ... 238, 236, 234), a single crystal Silicon semiconductor material 224 further including a plurality of M crystalline Silicon layers (220, 222, 224, 226, 228, 230), and the double bonding layer 248 further comprising a first bonding layer 246, and the second bonding layer 244. The first Silicon Carbide layer 242 includes the bottom surface of the Silicon Carbide substrate 241. The last N-th Silicon Carbide layer 234 includes a top surface 237 of the Silicon Carbide substrate 214. Each subsequent "k"-th Silicon Carbide layer is overlying the preceding "k−1"-th Silicon Carbide layer. The SiC substrate 214 is attached to the single crystal Silicon semiconductor material 224 via the double bonding layer 248.

Referring still to FIG. 4B, in one embodiment of the present invention, each "k"-th Silicon Carbide layer 224 includes a "k"-th conductivity type comprising the first conductivity type $(SiC)^I_k$, or the second conductivity type $(SiC)^{II}_k$, wherein "k" is an integer greater than one and less or equal to N. Each "k"-th Silicon Carbide layer includes a "k"-th dopant concentration $(N/P)^I_{SiC}$, or $(N/P)^{II}_{SiC}$.

Each subsequent "k"-th Silicon Carbide layer is grown on the preceding "k−1"-th Silicon Carbide layer. In one embodiment, at least one Silicon Carbide layer further comprises an epitaxially grown by CVD process Silicon Carbide layer, or an epitaxially grown by a molecular beam epitaxy (MBE) process Silicon Carbide layer. (Please, see discussion above).

Referring still to FIG. 4B, the Silicon Carbide based Silicon structure 210 further includes a plurality of M single crystal Silicon semiconductor material layers (222, 224, 226, 228, . . . 230). The first single crystal Silicon semiconductor material layer 230 is attached to the second bonding layer 244. Each subsequent "i"-th layer is overlying the preceding "i−1"-th layer. Herein, "i" is an integer greater than 1 and less or equal to M, M is an integer.

Referring still to FIG. 4B, in one embodiment of the present invention, each "i"-th crystalline Silicon layer includes the "i"-th conductivity type comprising the first conductivity type $(Si)^I_i$, or the second conductivity type $(Si)^{II}_i$. Each "i"-th crystalline Silicon layer includes an "i"-th dopant concentration $(N/P)^I_{Si}$, or $(N/P)^{II}_{Si}$.

The foregoing description of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A Silicon Carbide based Silicon structure comprising:
a Silicon Carbide substrate;
wherein said Silicon Carbide substrate further includes a plurality of N Silicon Carbide layers;
wherein a first Silicon Carbide layer of said plurality of N Silicon Carbide layers includes a bottom surface of said Silicon Carbide substrate;
wherein a last (Nth) Silicon Carbide layer of said plurality of N Silicon Carbide layers includes a top surface of said Silicon Carbide substrate;
each subsequent layer overlying a preceding layer;
each Silicon Carbide layer other than the first Silicon Carbide layer having a conductivity type selected from the group consisting of: {a first conductivity type; and a second conductivity type};
each Silicon Carbide layer other than the first Silicon Carbide layer having a dopant concentration;
each said subsequent Silicon Carbide layer being grown on said preceding Silicon Carbide layer;
a bonding layer overlying said Silicon Carbide substrate; and
a single crystal Silicon semiconductor material having a top surface;
said single crystal Silicon semiconductor material overlaying said bonding layer;
said single crystal Silicon semiconductor material bonded to said Silicon Carbide substrate via said bonding layer;
wherein said Silicon Carbide substrate is of a conductivity type selected from the group consisting of: {said first conductivity type, and said second conductivity type},
said Silicon Carbide substrate having a first dopant concentration;
said single crystal Silicon semiconductor material being of a conductivity type selected from the group consisting of: {said first conductivity type, and said second conductivity type}, said single crystal Silicon semiconductor material having a second dopant concentration.

2. The structure of claim 1, wherein at least one Silicon Carbide layer further comprises:
an epitaxially grown by a Chemical Vapor Deposition (CVD) process Silicon Carbide layer or an epitaxially grown by a molecular beam epitaxy (MBE) process Silicon Carbide layer.

3. A Silicon Carbide based Silicon structure comprising:
a Silicon Carbide substrate;
wherein said Silicon Carbide substrate is of a conductivity type selected from the
group consisting of: {a first conductivity type, and a second conductivity type}, said Silicon Carbide substrate having a first dopant concentration;
a bonding layer overlying said Silicon Carbide substrate; and
a single crystal Silicon semiconductor material having a top surface;
said single crystal Silicon semiconductor material overlaying said bonding layer;
said single crystal Silicon semiconductor material bonded to said Silicon Carbide substrate via said bonding layer,
said single crystal Silicon semiconductor material being of a conductivity type selected from the group consisting of: {said first conductivity type, and said second conductivity type}, said single crystal Silicon semiconductor material having a second dopant concentration;
wherein said single crystal Silicon semiconductor material further includes a plurality of M single crystal Silicon semiconductor material layers;
wherein a first of said plurality of M single crystal Silicon semiconductor material layers includes a bottom surface of said single crystal Silicon semiconductor material;
wherein a last of said plurality of M single crystal Silicon semiconductor material layers includes a top surface of said single crystal Silicon semiconductor material;
each subsequent layer overlying a preceding layer;
each said single crystal Silicon semiconductor material layer having an i-th conductivity type comprising said first conductivity type, or said second conductivity type;
each said single crystal Silicon semiconductor material layer having an i-th dopant concentration;
each said subsequent single crystal Silicon semiconductor material layer being grown on said preceding single crystal Silicon semiconductor material layer.

4. The structure of claim 3, wherein at least one single crystal Silicon semiconductor material layer further comprises:
an epitaxially grown by a Chemical Vapor Deposition (CVD) process single crystal Silicon semiconductor material layer, or an epitaxially grown by a molecular beam epitaxy (MBE) process single crystal Silicon semiconductor material layer.

5. A Silicon Carbide based Silicon structure comprising:
a Silicon Carbide substrate; wherein said Silicon Carbide substrate is of a conductivity type selected from the group consisting of: {a first conductivity type, and a second conductivity type}, said Silicon Carbide substrate having a first dopant concentration;
a bonding layer overlying said Silicon Carbide substrate;
a Silicon layer; and
a single crystal Silicon semiconductor material having a top surface;
  said single crystal Silicon semiconductor material being of a conductivity type selected from the group consisting of: {said first conductivity type, and said second conductivity type}, said single crystal Silicon semiconductor material having a second dopant concentration;
  said single crystal Silicon semiconductor material overlaying said bonding layer;
  said single crystal Silicon semiconductor material bonded to said Silicon Carbide substrate via said bonding layer.

6. A Silicon Carbide based Silicon structure comprising:
a Silicon Carbide substrate;
a bonding layer overlying said Silicon Carbide substrate; wherein said bonding layer further comprises:
  a carbon layer; and
a single crystal Silicon semiconductor material having a top surface; said single crystal Silicon semiconductor material overlaying said bonding layer; said single crystal Silicon semiconductor material bonded to said Silicon Carbide substrate via said bonding layer;
wherein said Silicon Carbide substrate is of a conductivity type selected from the group consisting of: {a first conductivity type, and a second conductivity type}, said Silicon Carbide substrate having a first dopant concentration; said single crystal Silicon semiconductor material being of a conductivity type selected from the group consisting of: {said first conductivity type, and said second conductivity type}, said single crystal Silicon semiconductor material having a second dopant concentration.

7. A Silicon Carbide based Silicon structure comprising:
a Silicon Carbide substrate;
a bonding layer overlying said Silicon Carbide substrate; wherein said bonding layer further comprises:
  a metal silicided layer selected from the group consisting of: {a tungsten silicide layer; a titanium silicide layer; and a cobalt silicide layer}; and
a single crystal Silicon semiconductor material having a top surface; said single crystal Silicon semiconductor material overlaying said bonding layer; said single crystal Silicon semiconductor material bonded to said Silicon Carbide substrate via said bonding layer;
wherein said Silicon Carbide substrate is of a conductivity type selected from the group consisting of: {a first conductivity type, and a second conductivity type}, said Silicon Carbide substrate having a first dopant concentration; said single crystal Silicon semiconductor material being of a conductivity type selected from the group consisting of: {said first conductivity type, and said second conductivity type}, said single crystal Silicon semiconductor material having a second dopant concentration.

8. A Silicon Carbide based Silicon structure comprising:
a Silicon Carbide substrate;
a bonding layer overlying said Silicon Carbide substrate;
a single crystal Silicon semiconductor material having a top surface; said single crystal Silicon semiconductor material overlaying said bonding layer; said single crystal Silicon semiconductor material bonded to said Silicon Carbide substrate via said bonding layer; and
at least one separation plug formed in said Silicon semiconductor material; said separation plug extending from said top surface of said Silicon semiconductor material into said Silicon Carbide substrate at a separation plug depth level, wherein said separation plug is configured to block the coupling between at least two adjacent active/passive structures, wherein each said active/passive structure is formed in said Silicon semiconductor material, said first active/passive structure extending from said top surface of said Silicon semiconductor material into said Silicon semiconductor material at a first active/passive structure depth level, said second active/passive structure extending from said top surface of said Silicon semiconductor material into said Silicon semiconductor material at a second active/passive structure depth level;
wherein said Silicon Carbide substrate is of a conductivity type selected from the group consisting of: {a first conductivity type, and a second conductivity type}, said Silicon Carbide substrate having a first dopant concentration; said single crystal Silicon semiconductor material being of a conductivity type selected from the group consisting of: {said first conductivity type, and said second conductivity type}, said single crystal Silicon semiconductor material having a second dopant concentration.

9. The structure of claim 8, wherein said separation plug further includes:
a trench filled with a material selected from the group consisting of:
  an oxide material, polySilicon material, a metal material, a silicided material, a tungsten silicide material, a titanium silicide material, a cobalt silicide material, and a platinum silicide material.

10. A Silicon Carbide based Silicon structure comprising:
a Silicon Carbide substrate;
a single crystal Silicon semiconductor material having a top surface; said single crystal Silicon semiconductor material being grown on said Silicon Carbide substrate; and
at least one separation plug formed in said single crystal Silicon semiconductor material; said separation plug extending from said top surface of said single crystal Silicon semiconductor material into said Silicon Carbide substrate at a separation plug depth level, wherein said separation plug is configured to block the coupling between at least two adjacent active/passive structures, wherein each said active/passive structure is formed in said single crystal Silicon semiconductor material, said first active/passive structure extending from said top surface of said single crystal Silicon semiconductor material into said single crystal Silicon semiconductor material at a first active/passive structure depth level, said second active/passive structure extending from said top surface of said single crystal Silicon semiconductor material into said single crystal Silicon semiconductor material at a second active/passive structure depth level;
wherein said Silicon Carbide substrate is of a conductivity type selected from the group consisting of: {a first conductivity type, and a second conductivity type}, said Silicon Carbide substrate having a first dopant concentration; said single crystal Silicon semiconductor material being of a conductivity type selected from the group consisting of: {said first conductivity type, and said second conductivity type}, said single crystal Silicon semiconductor material having a second dopant concentration.

11. The structure of claim 10, wherein said separation plug further includes:
   a trench filled with a material selected from the group consisting of:
      an oxide material, a polySilicon material, a metal material, a silicided material, a tungsten silicide material, a titanium silicide material, a cobalt silicide material, and a platinum silicide material.

12. A Silicon Carbide based Silicon structure comprising:
   a Silicon Carbide substrate;
   a double bonding layer overlying said Silicon Carbide substrate; and
   a single crystal Silicon semiconductor material having a top surface;
      said single crystal Silicon semiconductor material overlaying said double bonding layer;
      said single crystal Silicon semiconductor material bonded to said Silicon Carbide substrate via said double bonding layer;
   wherein said Silicon Carbide substrate further includes a plurality of N Silicon Carbide layers;
   wherein a first Silicon Carbide layer includes a bottom surface of said Silicon Carbide substrate;
   wherein a last N-th layer includes a top surface of said Silicon Carbide substrate;
   each subsequent k-th layer overlying a preceding (k−1)-th layer;
   each said k-th Silicon Carbide layer having a k-th conductivity type comprising a first conductivity type, or a second conductivity type;
   each said k-th Silicon Carbide layer having a k-th dopant concentration;
   each said subsequent k-th Silicon Carbide layer being grown on said preceding (k−1)-th Silicon Carbide layer;
   wherein k is an integer greater than 1, k is an integer less or equal to N, N is an integer.

13. The structure of claim 12, wherein at least one Silicon Carbide layer further comprises:
   an epitaxially grown by a Chemical Vapor Deposition (CVD) process Silicon Carbide layer or an epitaxially grown by a molecular beam epitaxy (MBE) process Silicon Carbide layer.

14. A Silicon Carbide based Silicon structure comprising:
   a Silicon Carbide substrate;
   a double bonding layer overlying said Silicon Carbide substrate; and
   a single crystal Silicon semiconductor material having a top surface;
      said single crystal Silicon semiconductor material overlaying said double bonding layer;
      said single crystal Silicon semiconductor material bonded to said Silicon Carbide substrate via said double bonding layer;
   wherein said single crystal Silicon semiconductor material further includes a plurality of M single crystal Silicon semiconductor material layers;
   wherein a first single crystal Silicon semiconductor material layer includes a bottom surface of said single crystal Silicon semiconductor material;
   wherein a last M-th layer includes a top surface of said single crystal Silicon semiconductor material;
   each subsequent i-th layer overlying a preceding (i−1)-th layer;
   each said i-th single crystal Silicon semiconductor material layer having an i-th conductivity type comprising a first conductivity type, or a second conductivity type;
   each said i-th single crystal Silicon semiconductor material layer having an i-th dopant concentration;
   each said subsequent i-th single crystal Silicon semiconductor material layer being grown on said preceding (i−1)-th single crystal Silicon semiconductor material layer;
   wherein i is an integer greater than 1, i is an integer less or equal to M, M is an integer.

15. The structure of claim 14, wherein at least one said i th single crystal Silicon semiconductor material layer further comprises:
   an epitaxially grown by a Chemical Vapor Deposition (CVD) process single crystal Silicon semiconductor material layer, or an epitaxially grown by a molecular beam epitaxy (MBE) process single crystal Silicon semiconductor material layer.

16. A Silicon Carbide based Silicon structure comprising:
   a Silicon Carbide substrate;
   a double bonding layer overlying said Silicon Carbide substrate; and
   a single crystal Silicon semiconductor material having a top surface; said single crystal Silicon semiconductor material overlaying said double bonding layer; said single crystal Silicon semiconductor material bonded to said Silicon Carbide substrate via said double bonding layer;
   wherein said double bonding layer further comprises:
      a Silicon dioxide layer; and
      a Silicon germanium (SiGe) layer;
   wherein said Silicon Carbide substrate is attached to said Silicon dioxide layer; and
   wherein said single crystal Silicon semiconductor material is attached to said Silicon germanium (SiGe) layer.

17. A Silicon Carbide based Silicon structure comprising:
   a Silicon Carbide substrate;
   a double bonding layer overlying said Silicon Carbide substrate; and
   a single crystal Silicon semiconductor material having a top surface; said single crystal Silicon semiconductor material overlaying said double bonding layer; said single crystal Silicon semiconductor material bonded to said Silicon Carbide substrate via said double bonding layer;
   wherein said double bonding layer further comprises:
      a carbon layer; and
      a Silicon germanium (SiGe) layer;
   wherein said Silicon Carbide substrate is attached to said carbon layer; and wherein said single crystal Silicon semiconductor material is attached to said Silicon germanium (SiGe) layer.

18. A Silicon Carbide based Silicon structure comprising:
   a Silicon Carbide substrate;
   a double bonding layer overlying said Silicon Carbide substrate; and
   a single crystal Silicon semiconductor material having a top surface; said single crystal Silicon semiconductor material overlaying said double bonding layer; said single crystal Silicon semiconductor material bonded to said Silicon Carbide substrate via said double bonding layer;
   wherein said double bonding layer further comprises:
      a metal silicided layer; and
      a Silicon germanium (SiGe) layer;

wherein said Silicon Carbide substrate is attached to said metal silicided layer;

and wherein said single crystal Silicon semiconductor material is attached to said Silicon germanium (SiGe) layer;

and wherein said metal silicided layer is selected from the group consisting of: a tungsten silicide layer; a titanium silicide layer; and a cobalt silicide layer.

19. A Silicon Carbide based Silicon structure comprising:

a Silicon Carbide substrate;

a double bonding layer overlying said Silicon Carbide substrate; and a single crystal Silicon semiconductor material having a top surface; said single crystal Silicon semiconductor material overlaying said double bonding layer; said single crystal Silicon semiconductor material bonded to said Silicon Carbide substrate via said double bonding layer;

further including:

at least one separation plug formed in said single crystal Silicon semiconductor material;

said separation plug extending from said top surface of said single crystal Silicon semiconductor material into said Silicon Carbide substrate at a separation plug depth level, wherein said separation plug is configured to block the coupling between at least two adjacent active/passive structures, wherein each said active/passive structure is formed in said single crystal Silicon semiconductor material, said first active/passive structure extending from said top surface of said single crystal Silicon semiconductor material into said single crystal Silicon semiconductor material at a first active/passive structure depth level, said second active/passive structure extending from said top surface of said single crystal Silicon semiconductor material into said single crystal Silicon semiconductor material at a second active/passive structure depth level.

20. The structure of claim 19, wherein said separation plug further includes:

a trench filled with a material selected from the group consisting of: an oxide material, polySilicon material, a metal material, a silicided material, a tungsten silicide material, a titanium silicide material, a cobalt silicide material, and a platinum silicide material.

* * * * *